US012575033B2

(12) United States Patent
Chen et al.

(10) Patent No.: US 12,575,033 B2
(45) Date of Patent: Mar. 10, 2026

(54) THERMOFORMING DEVICE AND METHOD FOR FLEXIBLE CIRCUIT BOARD

(71) Applicant: ZTE CORPORATION, Shenzhen (CN)

(72) Inventors: Da Chen, Shenzhen (CN); Fengying Wang, Shenzhen (CN); Yiming Li, Shenzhen (CN); Fugang Nie, Shenzhen (CN); Zhe Liu, Shenzhen (CN); Feng Wang, Shenzhen (CN); Yichuo Shi, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 350 days.

(21) Appl. No.: 18/546,511

(22) PCT Filed: Jan. 7, 2022

(86) PCT No.: PCT/CN2022/070784
§ 371 (c)(1),
(2) Date: Aug. 15, 2023

(87) PCT Pub. No.: WO2022/174690
PCT Pub. Date: Aug. 25, 2022

(65) Prior Publication Data
US 2024/0098902 A1 Mar. 21, 2024

(30) Foreign Application Priority Data
Feb. 18, 2021 (CN) .......................... 202110188050.7

(51) Int. Cl.
*H05K 3/00* (2006.01)

(52) U.S. Cl.
CPC ... *H05K 3/0014* (2013.01); *H05K 2203/0108* (2013.01); *H05K 2203/0278* (2013.01); *H05K 2203/1105* (2013.01)

(58) Field of Classification Search
CPC ................ H05K 3/0014; B29C 33/307; B29C 2043/5833
See application file for complete search history.

(56) References Cited

U.S. PATENT DOCUMENTS 6,908,583 B2    6/2005 Fiedler et al.
10,343,328 B1 *  7/2019 Sherga .................. B29C 51/428
(Continued)

FOREIGN PATENT DOCUMENTS

CN        206306599 U      7/2017
CN        207156293 U      3/2018
(Continued)

OTHER PUBLICATIONS

International Searching Authority. International Search Report and Written Opinion for PCT Application No. PCT/CN2022/070784 and English translation, mailed Apr. 8, 2022, pp. 1-10.
(Continued)

*Primary Examiner* — Andrew D Graham
(74) *Attorney, Agent, or Firm* — Vivacqua Crane, PLLC

(57) ABSTRACT

Disclosed are a thermoforming device and method for a flexible printed circuit board. The thermoforming device may include: a first forming mechanism provided with a first forming portion, the first forming portion being configured to carry the flexible printed circuit board to be processed; a second forming mechanism provided with a second forming portion which matches with the first forming portion, at least one of the first forming portion or the second forming portion is provided with a corresponding heating module configured for heat treatment of the flexible printed circuit board; a first driving mechanism configured to drive the first forming mechanism and the second forming mechanism to be displaced relative to each other in a first direction; a second driving mechanism configured to drive the second forming mechanism and the first forming mechanism to be
(Continued)

1

22
12
121
11   111
21 displaced relative to each other in a second direction perpendicular to the first direction; and a controller.

8 Claims, 4 Drawing Sheets

(56)                    References Cited

U.S. PATENT DOCUMENTS

| | | | | |
|---|---|---|---|---|
| 2007/0277575 | A1* | 12/2007 | Pohler | B29C 51/20 |
| | | | | 72/203 |
| 2009/0032289 | A1* | 2/2009 | Timms | H05K 1/0284 |
| | | | | 174/254 |
| 2010/0237544 | A1* | 9/2010 | Niebling | B29C 51/46 |
| | | | | 264/510 |
| 2011/0038979 | A1* | 2/2011 | Kumamoto | H01L 21/4842 |
| | | | | 425/411 |
| 2013/0119584 | A1* | 5/2013 | Vantrease | B29C 51/18 |
| | | | | 425/403.1 |
| 2013/0122130 | A1* | 5/2013 | Vantrease | B29C 51/46 |
| | | | | 425/150 |
| 2014/0018502 | A1* | 1/2014 | Sherga | C08L 33/20 |
| | | | | 525/184 |
| 2015/0151466 | A1* | 6/2015 | Cheng | B29C 43/58 |
| | | | | 425/169 |
| 2015/0343680 | A1* | 12/2015 | Arai | B29C 43/34 |
| | | | | 264/293 |
| 2016/0105950 | A1* | 4/2016 | Drzaic | H05K 3/0014 |
| | | | | 156/196 |
| 2016/0193759 | A1* | 7/2016 | Hattori | B29C 43/58 |
| | | | | 425/141 |
| 2016/0236381 | A1* | 8/2016 | Takemura | B29C 43/58 |
| 2016/0316570 | A1* | 10/2016 | De Vaan | H05K 3/0014 |
| 2017/0100875 | A1 | 4/2017 | Eo et al. | |
| 2017/0235220 | A1* | 8/2017 | Yamazaki | B29C 43/18 |
| | | | | 427/369 |
| 2017/0273197 | A1* | 9/2017 | Ohara | H05K 1/0284 |
| 2018/0160528 | A1* | 6/2018 | Michiwaki | H05K 1/0284 |
| 2018/0192507 | A1* | 7/2018 | Schöwel | F21S 41/192 |
| 2018/0199431 | A1* | 7/2018 | Schoewel | H05K 1/0296 |
| 2018/0264765 | A1* | 9/2018 | Ambrosini | B30B 15/007 |
| 2019/0061207 | A1* | 2/2019 | Terao | B29C 43/34 |
| 2019/0084214 | A1* | 3/2019 | Drexler | B29C 51/082 |
| 2019/0088388 | A1* | 3/2019 | Baba | H05K 1/11 |
| 2019/0248063 | A1* | 8/2019 | Tudor | B29C 70/46 |
| 2019/0329479 | A1* | 10/2019 | Vantrease | B29C 51/082 |
| 2021/0045241 | A1* | 2/2021 | Kasuya | H05K 1/183 |
| 2021/0068250 | A1* | 3/2021 | Vesce, III | H05K 3/0014 |
| 2021/0283890 | A1* | 9/2021 | Kamitsubo | H05K 3/429 |
| 2023/0225057 | A1* | 7/2023 | Deng | G09F 9/30 |
| | | | | 361/749 |

FOREIGN PATENT DOCUMENTS

| | | |
|---|---|---|
| CN | 110444121 A | 11/2019 |
| JP | 2016132202 A | 7/2016 |
| JP | 6717517 B1 | 7/2020 |
| KR | 20070065078 A | 6/2007 |
| KR | 1020180112323 A | 10/2018 |

OTHER PUBLICATIONS

European Patent Office. Extended European Search Report for EP Application No. 22755463.1, mailed Jun. 26, 2024, pp. 1-15.
The State Intellectual Property Office of People's Republic of China. First Office Action and Search Report for CN Application No. 202110188050.7 and English translation, mailed Nov. 13, 2025, pp. 1-16.

* cited by examiner

THERMOFORMING DEVICE AND METHOD FOR FLEXIBLE CIRCUIT BOARD

CROSS-REFERENCE TO RELATED APPLICATION

This application is a national stage filing under 35 U.S.C. § 371 of international application number PCT/CN2022/070784, filed Jan. 7, 2022, which claims priority to Chinese patent application No. 202110188050.7, filed Feb. 18, 2021. The contents of these applications are incorporated herein by reference in their entirety.

TECHNICAL FIELD

The present disclosure relates to the field of thermoforming, and more particularly, to a thermoforming device and method for a flexible printed circuit board.

BACKGROUND

With the advancement in science and technology, and driven by electronic products such as smart phones, tablet computers and touch control products, the market demand for Flexible Printed Circuit boards (FPCs) is also growing. A flexible printed circuit board can be freely bent, wound and folded in a specified space as required, which reduces the design difficulty, expands the design space and provides convenience for all-in-one configuration and integration of assembly. In order to realize the three-dimensional routing of the flexible printed circuit board, the flexible printed circuit board may need to be pre-bent and formed before assembly.

Especially for optical transceiver devices, several requirements are posed as follows on the process of forming of a flexible printed circuit board: the bending radius is required to be as large as possible, and the error of bending radius of batch products should be as small as possible, so as to ensure the consistency of product performance.

Current methods for forming flexible printed circuit board mainly adopt molding, which includes making a profiling mold based on the bent shape, placing the flexible printed circuit board in the profiling mold, applying a certain pressure and maintaining the pressure for a period of time, and removing the flexible printed circuit board thereafter, so as to form the flexible printed circuit board. Although in this way, the bent shape of the flexible printed circuit board can be substantially consistent with the expected shape, the processing and pressure holding time for the flexible printed circuit board is long, causing a waste of time in the welding process, and the flexible printed circuit board will gradually resume its original shape over time.

Therefore, it is an urgent technical problem to be solved by those having ordinary skills in the art to form a flexible printed circuit board quickly and accurately.

SUMMARY

The main object of embodiments of the present disclosure is to provide a thermoforming device and method for a flexible printed circuit board.

In a first aspect, an embodiment of the present disclosure provides a thermoforming device for a flexible printed circuit board. The device includes: a first forming mechanism provided with a first forming portion, the first forming portion being configured to carry the flexible printed circuit board to be processed; a second forming mechanism provided with a second forming portion which matches with the first forming portion, where at least one of the first forming portion or the second forming portion is provided with a corresponding heating module configured for heat treatment of the flexible printed circuit board; a first driving mechanism configured to drive the first forming mechanism and the second forming mechanism to be displaced relative to each other in a first direction; a second driving mechanism configured to drive the second forming mechanism and the first forming mechanism to be displaced relative to each other in a second direction perpendicular to the first direction; and a controller configured to control the first driving mechanism to drive at least one of the first forming mechanism or the second forming mechanism to move to a preset position in the first direction and control the second driving mechanism to drive at least one of the first forming mechanism or the second forming mechanism to move relative to each other in the second direction to press the flexible printed circuit board, and thermally bend the flexible printed circuit board to a preset shape by the heating module.

In a second aspect, an embodiment of the present disclosure provides a thermoforming method for a flexible printed circuit board, which is applied to a thermoforming device for a flexible printed circuit board. The device includes: a first forming mechanism provided with a first forming portion, the first forming portion being configured to carry the flexible printed circuit board to be processed; a second forming mechanism provided with a second forming portion which matches with the first forming portion, where at least one of the first forming portion or the second forming portion is provided with a corresponding heating module configured for heat treatment of the flexible printed circuit board; a first driving mechanism configured to drive the first forming mechanism and the second forming mechanism to be displaced relative to each other in a first direction; and a second driving mechanism configured to drive the second forming mechanism and the first forming mechanism to be displaced relative to each other in a second direction perpendicular to the first direction. The method includes: acquiring a control signal; and controlling, based on the control signal, the first driving mechanism to drive at least one of the first forming mechanism or the second forming mechanism to move to a preset position in the first direction and controlling the second driving mechanism to drive at least one of the first forming mechanism or the second forming mechanism to move relative to each other in the second direction to press the flexible printed circuit board, and thermally bend the flexible printed circuit board to a preset shape by the heating module.

BRIEF DESCRIPTION OF DRAWINGS

To clearly illustrate the technical schemes in the embodiments of the present disclosure, the accompanying drawings required for describing the embodiments will be introduced briefly below. Apparently, the accompanying drawings described below show only some embodiments of the present disclosure, and other drawings can be obtained by those having ordinary skills in the art from these accompanying drawings without creative efforts.

Figure 1:
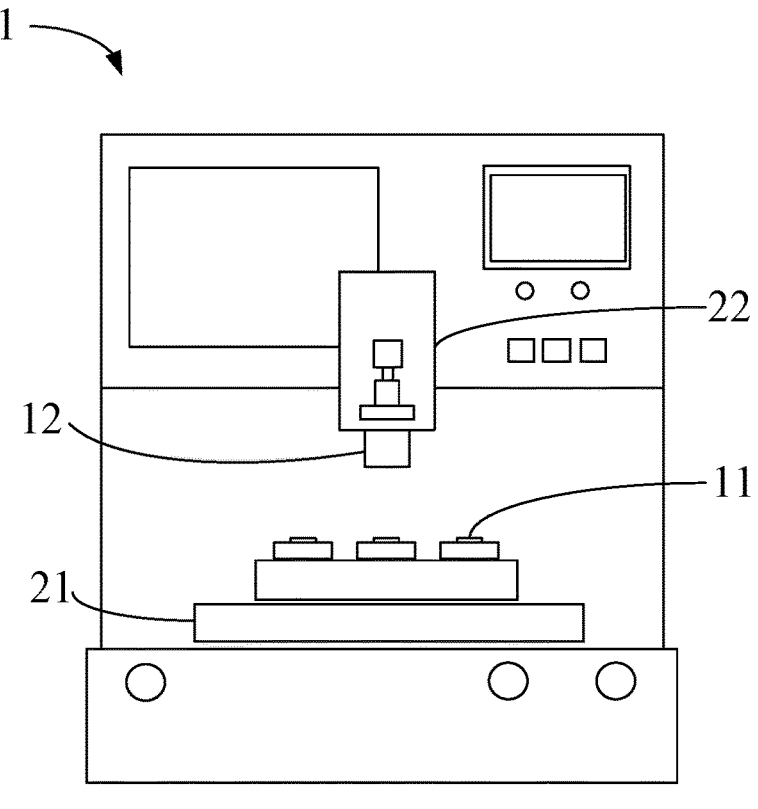
FIG. 1 is a schematic structural view of a thermoforming device for a flexible printed circuit board according to an embodiment of the present disclosure from a first perspective.

Reference numerals: 11, first forming mechanism; 12, second forming mechanism; 21, first driving mechanism; 22, second driving mechanism; 111, first forming portion; 112, limiting portion; 121, second forming portion; 211, first driving component; 212, second driving component; 30, supporting mechanism; 301, first supporting portion; 302, second supporting portion; 303, connecting portion; and 40, positioning mechanism.

DETAILED DESCRIPTION

The technical schemes in embodiments of the present disclosure will be clearly and completely described below in conjunction with the accompanying drawings in the embodiments of the present disclosure. Apparently, the embodiments described are only some but all of the embodiments of the present disclosure. All other embodiments obtained by those having ordinary skills in the art based on the embodiments of the present disclosure without creative efforts shall fall within the protection scope of the present disclosure.

The flowchart shown in the accompanying drawings is intended merely for illustration, and it is not necessary to include all the contents and operations/steps, nor to execute them in the described order. For example, some operations/steps may be divided, combined or partially merged, so the actual execution order may vary according to actual situations.

It should be understood that the terminology used in the description of the present disclosure is merely for the purpose of describing particular embodiments and is not intended to limit the present disclosure. As used in the description of the present disclosure and the claims, singular forms of "a", "an" and "the" are intended to include plural forms unless otherwise clearly indicated.

Some embodiments of the present disclosure will be described in detail in combination with the accompanying drawings. The embodiments described below and the features in the embodiments may be combined with each other if not in collision.

Referring to FIG. 1, an embodiment of the present disclosure provides a thermoforming device 1 for a flexible printed circuit board, which is configured to thermally bend the flexible printed circuit board to be processed to a preset shape.

The thermoforming device 1 includes a first forming mechanism 11, a second forming mechanism 12, a first driving mechanism 21, a second driving mechanism 22 and a controller. The first forming mechanism 11 is configured to carry the flexible printed circuit board to be processed. The second forming mechanism 12 matches with the first forming mechanism 11 to thermally bend the flexible printed circuit board to be processed to a preset shape. At least one of the first forming mechanism 11 or the second forming mechanism 12 is provided with a heating module that is configured for heat treatment of the flexible printed circuit board carried on the first forming mechanism 11.

Figure 2:
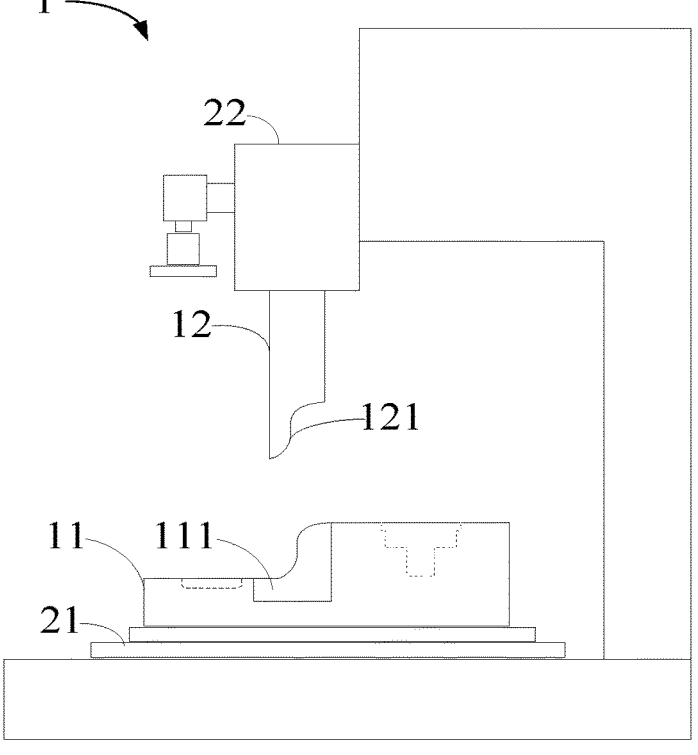
FIG. 2 is a schematic structural view of a thermoforming device for a flexible printed circuit board according to an embodiment of the present disclosure from a second perspective.
Figure 3:
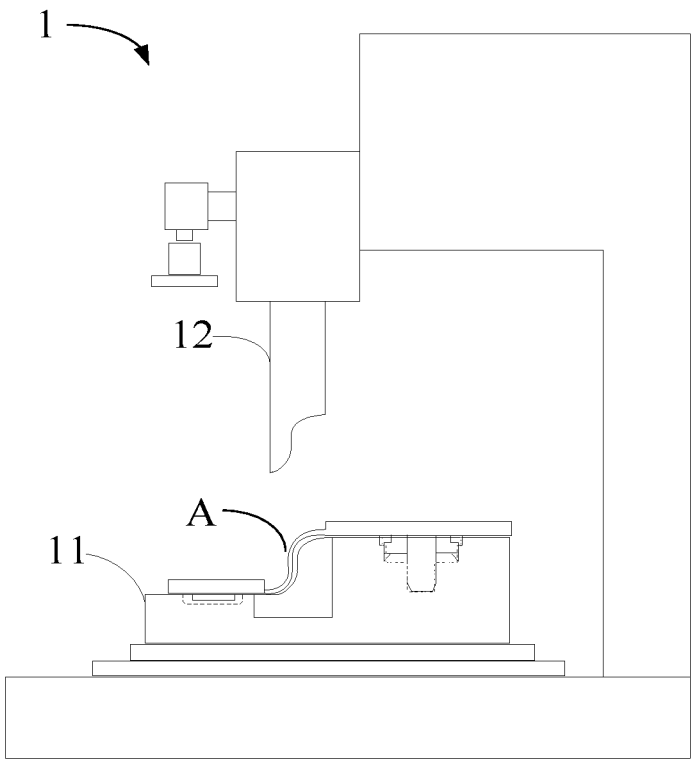
FIG. 3 is a schematic view showing the matching between a thermoforming device for a flexible printed circuit board according to an embodiment of the present disclosure and a flexible printed circuit board.

In an embodiment, referring to FIGS. 2 and 3, the first forming mechanism 11 is provided with a first forming portion 111 configured to carry a flexible printed circuit board A to be processed, and the second forming mechanism 12 is provided with a second forming portion 121 configured to match the first forming portion 111. At least one of the first forming portion 111 or the second forming portion 121 is provided with a heating module.

The shape of the first forming portion 111 and the second forming portion 121 is obtained based on an expected shape of the flexible printed circuit board A after processing.

Heat treatment is performed on the flexible printed circuit board A to be processed by the heating module to make the flexible printed circuit board A has plasticity. Then, the flexible printed circuit board A is pressed by the first forming portion 111 and the second forming portion 121 to form and fix the flexible printed circuit board A, so that the flexible printed circuit board A can be formed rapidly and accurately.

Figure 4:
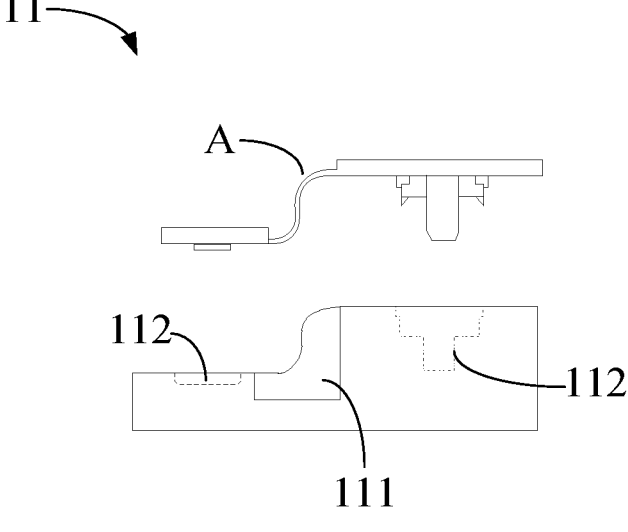
FIG. 4 is a schematic view showing the matching between a first forming mechanism of a thermoforming device according to an embodiment of the present disclosure and a flexible printed circuit board.

Referring to FIG. 4, in some embodiments, the first forming mechanism 11 is provided with a limiting portion 112 configured to fix the flexible printed circuit board, that is, to limit the position of the flexible printed circuit board A carried on the first forming portion 111. In an embodiment, the limiting portion 112 is configured according to the flexible printed circuit board A. For example, if both ends of the flexible printed circuit board A are provided with a protruding connector, a limiting portion 112 is provided correspondingly on each of two opposite sides of the first forming portion 111. In an embodiment, the limiting portion 112 is a limiting groove matching with the connector.

By providing a limiting portion 112 on the first forming mechanism 11, the flexible printed circuit board A carried on the first forming portion 111 can be prevented from being displaced during processing and causes poor forming effect.

The controller controls the first driving mechanism 21 to drive at least one of the first forming mechanism 11 or the second forming mechanism 12 to move in a first direction to a preset position. Then, the controller controls the second driving mechanism 22 to drive at least one of the first forming mechanism 11 or the second forming mechanism 12 to move in a second direction to press the flexible printed circuit board carried on the first forming mechanism 11, and thermally bend the flexible printed circuit board to a preset shape by the heating module. The first direction is perpendicular to the second direction, and the second direction is a direction in which the second forming mechanism 12 and the first forming mechanism 11 move towards or move away from each other. The preset position is a position where the second forming portion 121 directly faces the flexible printed circuit board A carried on the first forming portion 111. In this implementation, the second direction is a Z-axis direction.

The thermoforming device 1 may be provided with a corresponding control component, such as a button, a touch interface or the like, through which an operator sends a corresponding driving instruction to the thermoforming device 1 to control the first driving mechanism 21 and the second driving mechanism 22 to perform a corresponding operation. Alternatively, the controller may automatically acquire a current operating status of the thermoforming device 1 and control the first driving mechanism 21 and the second driving mechanism 22 to perform the corresponding operation depending on the current operating status, which is not limited here.

Figure 5:
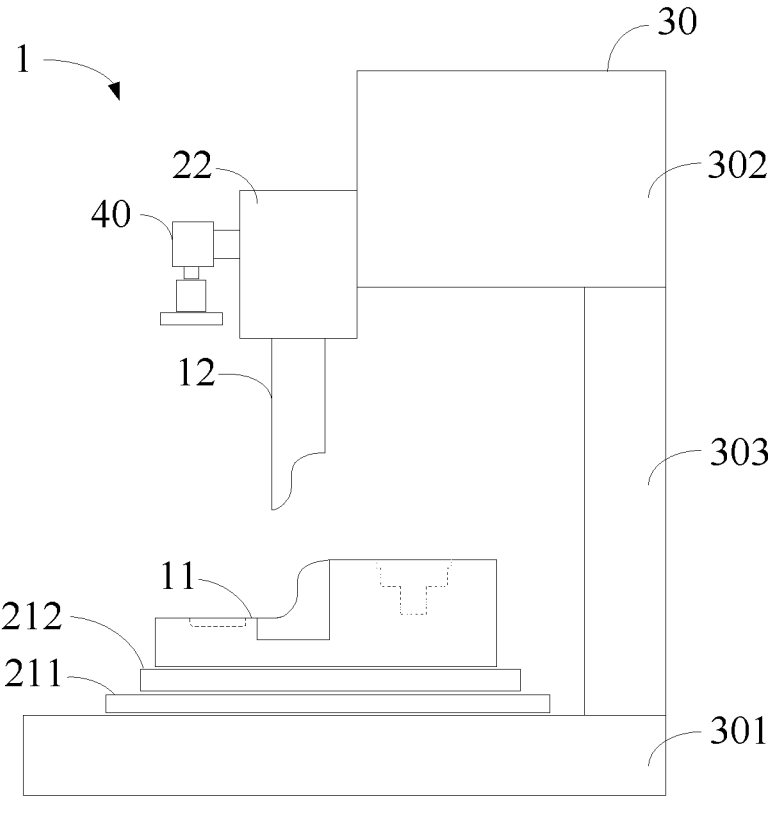
FIG. 5 is a schematic structural view of another thermoforming device for a flexible printed circuit board according to an embodiment of the present disclosure.

Referring to FIG. 5, in some embodiments, the thermoforming device 1 further includes a supporting mechanism 30. The supporting mechanism 30 includes a first supporting portion 301, a second supporting portion 302 and a connecting portion 303 connecting the first supporting portion 301 and the second supporting portion 302. The first supporting portion 301 is configured to support the first forming mechanism 11, and the second supporting portion 302 is configured to support the second forming mechanism 12. The second supporting portion 302 and the first supporting portion 301 are arranged spaced apart by the connecting portion 303 so that the first forming mechanism 11 and the second forming mechanism 12 are arranged spaced apart.

In some embodiments, the thermoforming device 1 is further provided with a positioning mechanism 40 which is configured to acquire relative position information of the first forming mechanism 11 and the second forming mechanism 12 so that the controller can automatically control the first driving mechanism 21 and the second driving mechanism 22 to perform a corresponding operation based on the position information.

In some examples, the positioning mechanism 40 is connected to the second driving mechanism 22. Position information of the first forming mechanism 11 is acquired by the positioning mechanism 40, and thus the relative position information of the first forming mechanism 11 and the second forming mechanism 12 is acquired.

For example, the positioning mechanism 40 includes an image acquisition device. The image acquisition device acquires image information of the first forming mechanism 11. The controller analyses the image information to obtain the relative position information of the first forming mechanism 11 and the second forming mechanism 12. The image acquisition device includes, but not limited to, a Charge-coupled Device (CCD), a Complementary Metal-Oxide-Semiconductor (CMOS) sensor or the like.

In this implementation, the operating principle of the thermoforming device 1 is described with an example in which the first driving mechanism 21 includes a first driving component 211 and a second driving component 212, the positioning mechanism 40 is connected to the second driving mechanism 22, and the positioning mechanism 40 is an image acquisition device.

Referring to FIG. 5, the first driving component 211 is connected to the first supporting portion 301, and is configured to drive the second driving component 212 and the first forming mechanism 11 to move in the first direction. The second driving component 212 is connected to the first driving component 211 and the first forming mechanism 11, and is configured to drive the first forming mechanism 11 to move in the first direction. The first direction includes at least two different directions.

In an embodiment, the first driving component 211 drives the second driving component 212 and the first forming mechanism 11 to move in an X-axis direction. The X-axis direction is a direction of towards or away from the connection between the first supporting portion 301 and the connecting portion 303. The second driving component 212 drives the first forming mechanism 11 to move in a Y-axis direction perpendicular to the X-axis direction. The second driving mechanism 22 drives the second forming mechanism 12 to move in the second direction perpendicular to both the Y-axis direction and the X-axis direction.

The controller determines whether the first forming mechanism 11 is in a preset position relative to the second forming mechanism 12 based on the position information acquired by the positioning mechanism 40.

In an embodiment, the first forming mechanism 11 is provided with a reference point M. The position information of the first forming mechanism 11 is acquired by acquiring position information of the point M, and it is determined whether the point M is located at the preset position to determine whether the first forming mechanism 11 is located at the preset position.

Figure 6A:
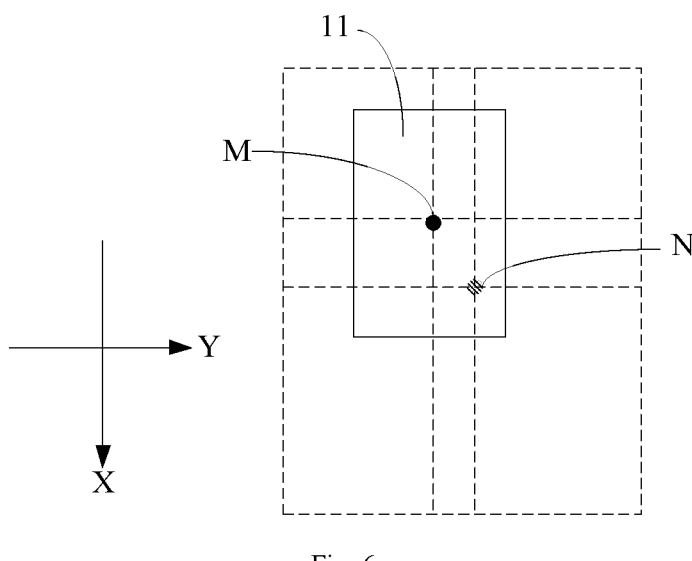
FIG. 6*a* is a schematic view showing a scenario for a thermoforming device for a flexible printed circuit board according to an embodiment of the present disclosure.

Referring to FIG. 6a, in the image information acquired by the image acquisition device, a point N is the preset position for the point M. Through analysis of the image information, it can be known that the point M is currently not located at the preset position. Displacement information of the first driving component 211 in the X-axis direction and displacement information of the second driving component 212 in the Y-axis direction are obtained based on relative position information of the point N and the point M. The controller controls the first driving component 211 and the second driving component 212 to drive the first forming mechanism 11 to move based on the displacement information.

Figure 6B:
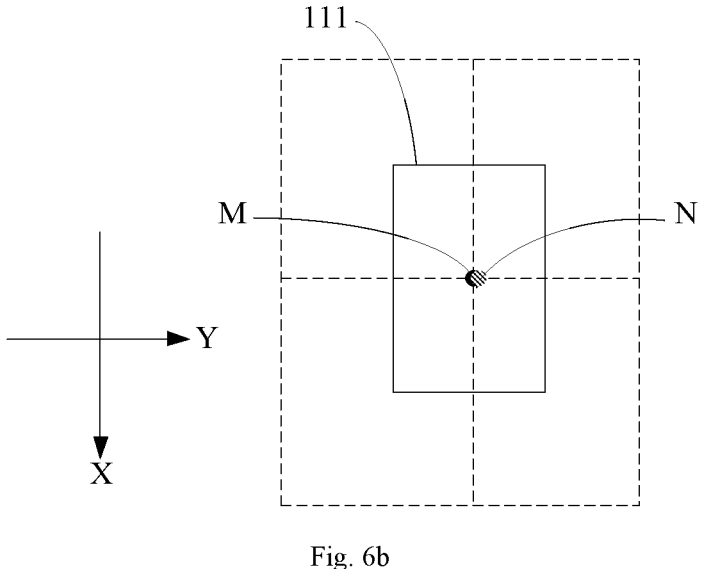
FIG. 6*b* is a schematic view showing another scenario for a thermoforming device for a flexible printed circuit board according to an embodiment of the present disclosure.

Referring to FIG. 6b, after the first forming mechanism 11 completes movement, when it is determined that a distance between the point N and the point M is less than a preset value through analysis of the image information acquired again by the image acquisition device, it is indicated that the point M is currently located at the preset position, i.e., the first forming mechanism 11 is located at the preset position.

Figure 7:
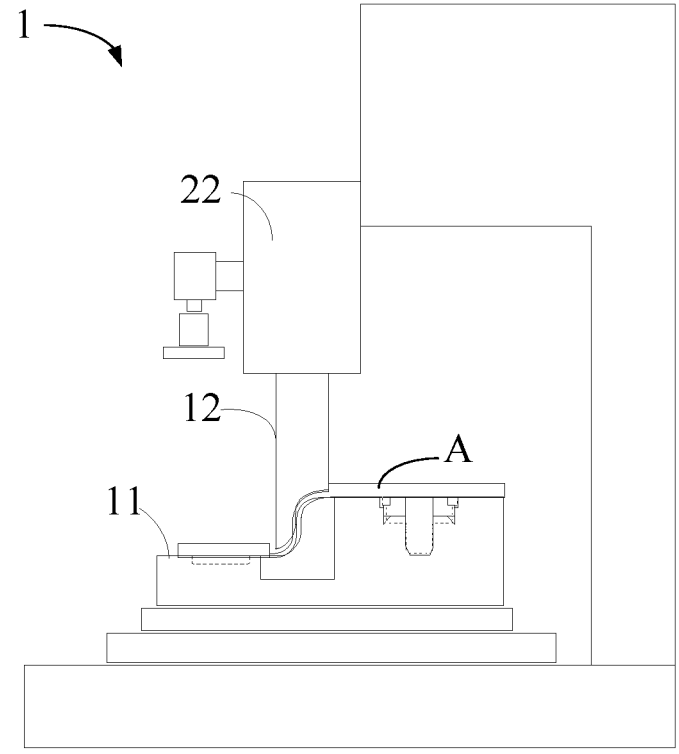
FIG. 7 is a schematic view showing still another scenario for a thermoforming device for a flexible printed circuit board according to an embodiment of the present disclosure.

Referring to FIG. 7, once the first forming mechanism 11 is located at the preset position, the controller controls the second driving mechanism 22 to drive the second forming mechanism 12 to move in the second direction so that the second forming mechanism 12 cooperates with the first forming mechanism 11 to press the flexible printed circuit board A carried on the first forming mechanism 11, and thermally bend the flexible printed circuit board A to a preset shape by heating the flexible printed circuit board A using the heating module.

The second driving mechanism 22 drives at least one of the first forming mechanism 11 or the second forming mechanism 12 to move to the preset positions, so as to avoid affecting the forming effect of the flexible printed circuit board A due to misalignment of the first forming portion 111, the second forming portion 121 and the flexible printed circuit board A to be processed during thermoforming of the flexible printed circuit board A by the first forming portion 111 and the second forming portion 121.

In some embodiments, as shown in FIG. 1, the thermoforming device 1 is provided with at least two first forming mechanisms 11 arranged spaced apart, so that the thermoforming device 1 can process flexible printed circuit boards in batch, thereby improving the production efficiency.

In some embodiments, the corresponding first forming portion 111 and second forming portion 121 can be adopted for replacement depending on the actual demand on the expected shape of the flexible printed circuit board in the process of production, so that the thermoforming device 1 can thermally bend the flexible printed circuit board being processed into different shapes.

In some implementations, the controller includes a memory, a processor and a communication interface. The communication interface, the memory and the processor are connected via bus for communication.

The memory may be a volatile memory, such as a Random Access Memory (RAM); or a non-volatile memory, such as a Read Only Memory (ROM), a flash memory, a Hard Disk Drive (HDD) or a Solid-State Drive (SSD); or a combination oft memories described above. The memory is configured to store computer programs and can provide instructions and data to the processor.

The processor may be a Central Processing Unit (CPU). The processor may also be another general-purpose processor, Digital Signal Processor (DSP), Application Specific Integrated Circuit (ASIC), Field-Programmable Gate Array (FPGA) or another programmable logic device, discrete gate or transistor logic device, discrete hardware component or the like. The general-purpose processor may be a microprocessor or the processor may be any conventional processor and so forth.

For the embodiments described above, the descriptions of each embodiment have their own emphases. For the parts that are not detailed in an embodiment, reference may be made to the detailed description below of a thermoforming method for a flexible printed circuit board, which will not be repeated here.

In the following, the thermoforming method for a flexible printed circuit board according to an embodiment of the present disclosure will be described in conjunction with the operating principle of the thermoforming device 1 for the flexible printed circuit board.

This thermoforming method for a flexible printed circuit board is applied to the thermoforming device 1 for the flexible printed circuit board. This thermoforming method includes acquiring a control signal.

The control signal may be proactively triggered by the operator. For example, after confirming that the flexible printed circuit board A to be processed has been placed correctly on the first forming mechanism 11, the operator sends a control signal to the thermoforming device 1 with a button, a touch interface or the like provided on the thermoforming device 1 or with a terminal device, such as a cell phone, a computer, or the like, connected to the thermoforming device 1 to enable the thermoforming device 1 to start processing of the flexible printed circuit board A.

Alternatively, the control signal may be generated automatically by the thermoforming device 1. For example, the thermoforming device 1 is provided with an image acquisition device which is configured to acquire the image information of the first forming mechanism 11. It is determined whether the flexible printed circuit board A to be processed is placed correctly on the first forming mechanism 11 through analysis of the acquired image information. If the flexible printed circuit board A is placed correctly on the first forming mechanism 11, a control signal is generated to enable the thermoforming device 1 to start processing of the flexible printed circuit board A.

Upon receiving the control signal, the thermoforming device 1 enters a processing mode to thermally bend the flexible printed circuit board A to be processed to a preset shape.

Once the thermoforming device 1 enters the processing mode, the first driving mechanism 21 is controlled to drive at least one of the first forming mechanism 11 or the second forming mechanism 12 to move to a preset position in the first direction. The second driving mechanism 22 is controlled to drive at least one of the first forming mechanism 11 or the second forming mechanism 12 to move relative to each other in the second direction to press the flexible printed circuit board A. The flexible printed circuit board A carried on the first forming portion 11 is thermally bent to a preset shape by the heating module.

For detailed implementation steps of this embodiment, reference may be made to the foregoing description of the operating principle of the thermoforming device 1, which will not be repeated here.

By driving the first forming mechanism 11 or the second forming mechanism 12 to move to the preset position by the first driving mechanism 21 and the second driving mechanism 22 drive, the problem of inaccurate forming of the flexible printed circuit board caused due to the misalignment of the first forming portion 111, the second forming portion 121 and the flexible printed circuit board A carried on the first forming portion 111 is prevented. Meanwhile, by driving the first forming mechanism 11 and the second forming mechanism 12 to press the flexible printed circuit board A by the second driving mechanism 22 and heating the flexible printed circuit board A by the heating module, the flexible printed circuit board A can be formed more rapidly, and the processed flexible printed circuit board A can maintain its shape for a long time, improving the production efficiency.

In some embodiments, after the flexible printed circuit board A carried on the first forming portion 111 is thermally bent to the preset shape, the method further includes: controlling the heating module to stop heating, so that the flexible printed circuit board A carried on the first forming portion 111 is cooled in the preset shape; and after the flexible printed circuit board A has been cooled in the preset shape for a preset period of time, controlling the second driving mechanism 22 to drive at least one of the first forming mechanism 11 or the second forming mechanism 12 to enable the first forming mechanism 11 to move away from the second forming mechanism 12.

By cooling the flexible printed circuit board A which has already assumed the preset shape, the plasticity of the flexible printed circuit board A is reduced, so as to prevent deformation of the flexible printed circuit board A after the processing due to the remnant heat. The second driving mechanism 22 drives at least one of the first forming mechanism 11 or the second forming mechanism 12 to move the first forming mechanism 11 and the second forming mechanism 12 away from each other, so as to facilitate removal of the processed flexible printed circuit board A from the first forming portion 111 by the operator.

The present disclosure provides a thermoforming device and method for a flexible printed circuit board. The device includes: a first forming mechanism provided with a first forming portion, the first forming portion being configured to carry the flexible printed circuit board to be processed; a second forming mechanism provided with a second forming portion which matches with the first forming portion, where at least one of the first forming portion or the second forming portion is provided with a corresponding heating module configured for heat treatment of the flexible printed circuit board; a first driving mechanism configured to drive the first forming mechanism and the second forming mechanism to be displaced relative to each other in a first direction; a second driving mechanism configured to drive the second forming mechanism and the first forming mechanism to be displaced relative to each other in a second direction perpendicular to the first direction; and a controller configured to control the first driving mechanism to drive at least one of the first forming mechanism or the second forming mechanism to move to a preset position in the first direction and control the second driving mechanism to drive at least one of the first forming mechanism or the second forming mechanism to move relative to each other in the second direction to press the flexible printed circuit board, and thermally bend the flexible printed circuit board to a preset shape by the heating module. By heating the flexible printed circuit board by at least one of the first forming mechanism or the second forming mechanism, the time spent for forming the flexible printed circuit board is shorter, and the formed flexible printed circuit board has a normalized bent shape which can be maintained for a long time, thereby improving the production efficiency.

Those having ordinary skills in the art can understand that all or some of the steps in the method and functional modules/units in the system or device disclosed above can be implemented as software, firmware, hardware and appropriate combinations thereof. In the hardware embodiment, the division between functional modules/units mentioned in the description above does not necessarily correspond to the division between physical components. For example, a physical component may have multiple functions, or a function or step may be executed by several physical components in cooperation. Some or all of the physical components may be implemented as software executed by a processor, such as a central processing unit, a digital signal processor or a microprocessor, or as hardware, or as an integrated circuit, such as an application specific integrated circuit. Such software may be distributed on a computer-readable medium, which may include a computer storage medium (or a non-transitory medium) and a communication medium (or a transitory medium). As is well known those having ordinary skills in the art, the term computer storage medium includes volatile and nonvolatile, removable and non-removable medium implemented in any method or technique for storing information, such as computer-readable instructions, data structures, program modules or other data. A computer storage medium includes, but not limited to, RAM, ROM, EEPROM, flash memory or another memory technique, CD-ROM, Digital Versatile Disc (DVD) or another optical disc storage, a magnetic cassette, a magnetic tape, a magnetic disk storage or another magnetic storage device, or any other medium that can be used to store desired information and can be accessed by a computer. Furthermore, it is well known to those having ordinary skills in the art that a communication medium usually contains computer-readable instructions, data structures, program modules or other data in a modulated data signal such as a carrier wave or another transmission mechanism, and may include any information delivery medium.

It should be understood that the term "and/or" used in the description of the present disclosure and the following claims refers to any combination and all possible combinations of one or more of the associated listed items, and includes these combinations. It should be noted that the terms "include", "comprise" or any other variation thereof used herein are intended to cover non-exclusive inclusion, so that a process, method, article or system including a series of elements includes not only those elements, but also other elements not explicitly listed, or elements inherent to such process, method, article or system. Without more restrictions, an element defined by the phrase "including a(n)" does not exclude the existence of other identical elements in the process, method, article or system that includes the element.

The above serial numbers of the embodiments of the present disclosure are intended only for description, and do not represent the preference of the embodiments. Described above are only specific embodiments of the present disclosure, but the protection scope of the present disclosure is not limited thereto. Various equivalent modifications or substitutions within the technical scope disclosed in the present disclosure can easily occur to those having ordinary skills in the art and all such modifications or substitutions shall fall within the protection scope of the present disclosure. Therefore, the protection scope of the present application is defined by the claims.

What is claimed is:

1. A thermoforming device for a flexible printed circuit board, comprising:

a first forming mechanism provided with a first forming portion, the first forming portion being configured to carry the flexible printed circuit board to be processed;

a second forming mechanism provided with a second forming portion which matches with the first forming portion, wherein at least one of the first forming portion or the second forming portion is provided with a corresponding heater configured for heat treatment of the flexible printed circuit board;

a first driving mechanism configured to drive the first forming mechanism and the second forming mechanism to be displaced relative to each other in a first direction;

a second driving mechanism configured to drive the second forming mechanism and the first forming mechanism to be displaced relative to each other in a second direction perpendicular to the first direction; and a controller configured to control the first driving mechanism to drive at least one of the first forming mechanism or the second forming mechanism to move to a preset position in the first direction and control the second driving mechanism to drive at least one of the first forming mechanism or the second forming mechanism to move relative to each other in the second direction to press the flexible printed circuit board, and thermally bend the flexible printed circuit board to a preset shape by performing the heat treatment on the flexible printed circuit board by the heater to make the flexible printed circuit board have plasticity;

wherein the first forming mechanism is provided with a limiting portion configured to fix the flexible printed circuit board;

wherein both ends of the flexible printed circuit board are provided with a protruding connector, the limiting portion is provided on each of two opposite sides of the first forming portion, the limiting portion is a limiting groove matching with the protruding connector.

2. The thermoforming device of claim 1, wherein the thermoforming device further comprises a supporting mechanism, and the supporting mechanism comprises a first supporting portion configured to support the first forming mechanism, a second supporting portion configured to support the second forming mechanism, and a connecting portion connecting the first supporting portion and the second supporting portion.

3. The thermoforming device of claim 2, wherein the first driving mechanism comprises a first driving component and a second driving component, the first driving component being connected to the first supporting portion, and the second driving component being connected to the first driving component and the first forming mechanism.

4. The thermoforming device of claim 3, wherein at least two first forming mechanisms are provided and are arranged spaced apart on the second driving component.

5. The thermoforming device of claim 3, further comprising a positioning mechanism configured to acquire relative position information of the first forming mechanism and the second forming mechanism, so that the controller controls at least one of the first driving mechanism or the second driving mechanism to perform a corresponding operation based on the relative position information.

6. The thermoforming device of claim 5, wherein the positioning mechanism comprises an image acquisition device configured to acquire image information of the first forming mechanism and the second forming mechanism so as to acquire the relative position information based on the image information.

7. The thermoforming device of claim 5, wherein the positioning mechanism is connected to the second driving mechanism.

8. A thermoforming method for a flexible printed circuit board, applied to a thermoforming device for the flexible printed circuit board, wherein the thermoforming device comprises:

a first forming mechanism provided with a first forming portion, the first forming portion being configured to carry the flexible printed circuit board to be processed;

a second forming mechanism provided with a second forming portion which matches with the first forming portion, wherein at least one of the first forming portion or the second forming portion is provided with a corresponding heater configured for heat treatment of the flexible printed circuit board;

a first driving mechanism configured to drive the first forming mechanism and the second forming mechanism to be displaced relative to each other in a first direction; and a second driving mechanism configured to drive the second forming mechanism and the first forming mechanism to be displaced relative to each other in a second direction perpendicular to the first direction;

and the method comprises:

acquiring a control signal; and controlling, based on the control signal, the first driving mechanism to drive at least one of the first forming mechanism or the second forming mechanism to move to a preset position in the first direction and controlling the second driving mechanism to drive at least one of the first forming mechanism or the second forming mechanism to move relative to each other in the second direction to press the flexible printed circuit board, and thermally bend the flexible printed circuit board to a preset shape by performing the heat treatment on the flexible printed circuit board by the heater to make the flexible printed circuit board have plasticity;

wherein the first forming mechanism is provided with a limiting portion configured to fix the flexible printed circuit board;

wherein both ends of the flexible printed circuit board are provided with a protruding connector, the limiting portion is provided on each of two opposite sides of the first forming portion, the limiting portion is a limiting groove matching with the protruding connector.

* * * * *